United States Patent [19]

Iizuka

[11] Patent Number: 4,999,671
[45] Date of Patent: Mar. 12, 1991

[54] RETICLE CONVEYING DEVICE

[75] Inventor: Kazuo Iizuka, Yokohama, Japan

[73] Assignee: Canon Kabushiki Kaisha, Tokyo, Japan

[21] Appl. No.: 528,903

[22] Filed: May 29, 1990

Related U.S. Application Data

[63] Continuation of Ser. No. 368,894, Jun. 21, 1989, abandoned, which is a continuation of Ser. No. 71,742, Jul. 9, 1987, abandoned.

[30] Foreign Application Priority Data

| Jul. 11, 1986 | [JP] | Japan | 61-162131 |
| Jul. 11, 1986 | [JP] | Japan | 61-162132 |
| Jul. 11, 1986 | [JP] | Japan | 61-162133 |
| Jul. 11, 1986 | [JP] | Japan | 61-162134 |
| Jul. 11, 1986 | [JP] | Japan | 61-162135 |
| Jul. 11, 1986 | [JP] | Japan | 61-162136 |
| Jul. 11, 1986 | [JP] | Japan | 61-162137 |
| Jul. 11, 1986 | [JP] | Japan | 61-162138 |
| Jul. 11, 1986 | [JP] | Japan | 61-162139 |
| Jul. 11, 1986 | [JP] | Japan | 61-162140 |

[51] Int. Cl.$^5$ .................................... G03B 27/04
[52] U.S. Cl. ........................... 355/97; 355/23; 355/75
[58] Field of Search .............. 355/23, 53, 79, 75, 355/97

[56] References Cited

U.S. PATENT DOCUMENTS

| 3,823,836 | 7/1974 | Cheney et al. | 414/331 X |
| 4,135,800 | 1/1979 | Weidenz et al. | 206/455 X |
| 4,295,565 | 10/1981 | Takeuchi | 206/455 |
| 4,319,833 | 3/1982 | Hidding | 355/23 |
| 4,423,959 | 1/1984 | Nakazawa et al. | 356/400 |
| 4,501,527 | 2/1985 | Jacoby et al. | 414/225 |
| 4,556,362 | 12/1985 | Bahnek et al. | 414/225 X |
| 4,603,968 | 8/1986 | Schmidt | 355/53 |
| 4,611,967 | 9/1986 | Tsutsui | 414/411 |
| 4,674,867 | 6/1987 | Kitai et al. | 355/97 |
| 4,677,301 | 6/1987 | Tanimoto et al. | 250/548 |
| 4,681,429 | 7/1987 | Spence-Bate et al. | 355/73 |
| 4,687,542 | 8/1987 | Davis et al. | 414/411 X |
| 4,712,016 | 12/1987 | Matsumura | 250/548 |
| 4,757,355 | 7/1988 | Iizuka et al. | 355/75 |
| 4,758,127 | 7/1988 | Imu et al. | 414/411 |
| 4,764,076 | 8/1988 | Layman et al. | 414/225 X |

FOREIGN PATENT DOCUMENTS

| 57-64928 | 4/1982 | Japan | 414/411 |
| 60-17919 | 1/1985 | Japan | 414/783 |

Primary Examiner—Monroe H. Hayes
Attorney, Agent, or Firm—Fitzpatrick, Cella, Harper & Scinto

[57] ABSTRACT

A reticle conveying system includes a reticle keeping shelf for keeping therein a plurality of reticles; a first conveying portion for selecting and extracting a desired reticle out of the reticle keeping shelf and for conveying the extracted reticle to a predetermined position; and a second conveying portion for conveying the reticle from the predetermined position back into the reticle keeping shelf; wherein the first conveying portion is operable to convey the extracted reticle to the predetermined position by way of a first conveying path defined exclusively for the reticle as it is conveyed to the predetermined position and wherein said second conveying portion is operable to convey the reticle back into the reticle keeping shelf by way of a second conveying path different from the first conveying path and defined exclusively for the reticle as it is conveyed back into the reticle keeping shelf.

10 Claims, 9 Drawing Sheets

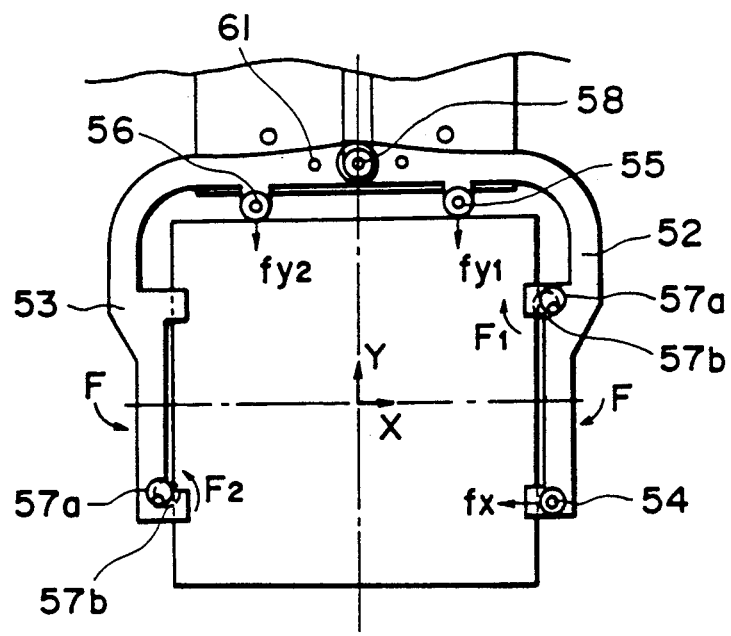
FIG. 10
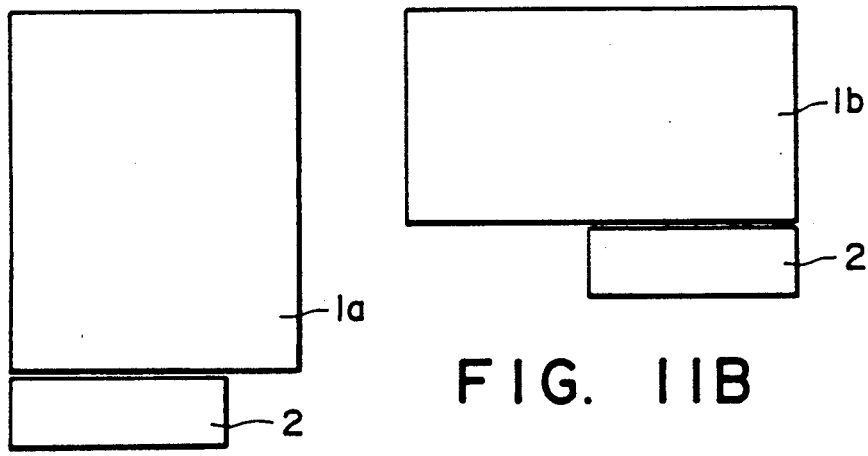
FIG. 11A
FIG. 11B
FIG. 11C

RETICLE CONVEYING DEVICE

This application is a continuation of application Ser. No. 368,894, filed June 21, 1989, which application is a continuation of application Ser. No. 071,742, filed July 9, 1987, both now abandoned.

FIELD OF THE INVENTION AND RELATED ART

This invention relates to a conveying device and, more particularly, to a conveying device for conveying thin plate-like articles such as masks or reticles usable in the manufacture of semiconductor devices such as integrated circuits. Particularly, the conveying device of the present invention is suitably usable in an automatic changing apparatus operable to automatically change thin plate-like articles (each hereinafter simply "reticle").

In the field of manufacture of semiconductor devices, for example, such a reticle conveying device is used in an automatic reticle changing apparatus having a cassette library adapted to store therein a plurality of reticle cassettes each for containing a reticle.

Conventionally, reticle conveying devices of the type described above and used in the field of manufacture of semiconductor devices are so constructed that a desired reticle is extracted out of a corresponding one of plural reticle cassettes which are held in a cassette library fixedly coupled to a main assembly of a semiconductor device manufacturing exposure apparatus. The extracted reticle is conveyed along a long conveying path to an inspecting device, for inspecting for the presence/absence of dust or foreign particles on the reticle, and the thus inspected reticle is supplied along a similar long conveying path to an exposure station defined in the main assembly of the exposure apparatus. This requires a long time period for changing reticles, with the result that the exposure apparatus must disadvantageously be retained in a stand-by state for a long time.

Usually, as for the semiconductor device manufacturing line, there are a mass production line adapted to produce a small number of types of semiconductor devices, as well as a short-run-job production line adapted to produce many varieties of semiconductor devices. In the latter case, a large number of reticles are used so that it is necessary to change reticles frequently. Accordingly, the disadvantage of requiring a long time for the reticle changing (i.e. a long-time stand-by state of the exposure apparatus) directly leads to a problem of reduction in the productivity to a great extent.

Also, the long conveying path for the reticle increases the probability of adhesion of dust or foreign particles to the reticle being conveyed. Particularly, in a case of step-and-repeat type projection exposure apparatus, called "steppers", wherein images of a pattern of each reticle are photoprinted on different portions of a wafer in a reduced scale, the fraction defective of semiconductor chips increases due to the damage of each chip or printing zone resulting from the adhesion of foreign particles to the reticle. It is very difficult to keep a completely clean environment that surrounds the whole of the long conveying path.

While it may be possible to reduce the adhesion of foreign particles to the reticle by placing the whole or a main part of the reticle changing apparatus in a dustless box or chamber, this provides little effect upon dust or foreign particles generated from a mechanical device or devices, such as the conveying device, accommodated in such dustless box.

A further inconvenience is found in that, in conventional type reticle changing apparatuses using reticle cassettes, each reticle kept in a cassette has to be oriented manually and preparatorily in accordance with a device or mechanism with which the reticle is to be handled. Such manual working itself is cumbersome. Moreover, an operator himself or herself is a source of dust or foreign particles. Therefore, the fraction of reticles which are defective increases disadvantageously.

Also, in conventional apparatuses, after a reticle is moved to the exposure station, one or more alignment marks provided on the reticle are detected and, by aligning these alignment marks with respect to predetermined positional reference marks provided on the exposure station, the reticle is set at a predetermined position. Usually, each reticle has various information recorded thereon and concerning the exposure process conditions and so on. Conventionally, data corresponding to such information is inputted into the exposure apparatus manually by an operator before the reticle is used. Alternatively, in a case of fully automatized apparatuses, the information recorded on the reticle is read or detected by the exposure apparatus just when the reticle is set at the exposure station.

Furthermore, in conventional type automatic reticle changing apparatuses, the cassette library is fixedly mounted to the main assembly of the apparatus. For this reason, the number of reticles that can be interchangeably used with an unmanned working is limited. Particularly, in a case where such a number of reticles that is greater than the number of reticles which can be accommodated in the cassette library are to be used interchangeably, such as in the case of the short-run-job production line, some cassettes in the library have to be replaced by excessive cassettes which may be placed on an additional cassette keeping shelf or the like disposed outside the cassette library. Such replacement is usually made by an operator. Such manual working itself is cumbersome. Moreover, an operator himself or herself is a source of dust or foreign particles, that can not be disregarded. Therefore, the fraction defective increases disadvantageously. Manual operations are also required when reticles having been treated peripheral equipments such as a pellicle film applying device, a reticle cleaning device, etc., are introduced into the cassette library. A similar problem exists in this case. Moreover, each time the cassettes are changed or introduced into the library, a body of data concerning various parameters such as the cassette holding position, the identity of the cassette, etc., has to be inputted into the apparatus by the operator's manual working.

SUMMARY OF THE INVENTION

It is accordingly a primary object of the present invention to avoid all the problems described hereinbefore and to provide a conveying apparatus which is particularly suitably applicable to a reticle changing apparatus for use in a semiconductor device manufacturing exposure apparatus, for conveying reticles in a manner that makes the exposure apparatus matched, particularly, with the short-run-job production line for the manufacture of many varieties of semiconductor devices.

It is a second object of the present invention to provide a reticle conveying device which facilitates the delivery of each reticle at least in two directions and which can be suitably matched with the branching of the reticle conveying path.

It is a third object of the present invention to provide a reticle conveying device which is operable to convey a reticle between a reticle storing station at which the reticle is stored into and kept in a container and a predetermined reticle delivering and receiving station, while minimizing the rate of adhesion of dust or foreign particles to the reticle being conveyed.

It is a fourth object of the present invention to provide a reticle conveying device which is operable with a scatter of only a very small amount of dust or foreign particles.

It is a fifth object of the present invention to provide a reticle conveying device suitably usable in a semiconductor device manufacturing exposure apparatus, for handling reticles in a manner that avoids the necessity of manual orientation of each reticle within a reticle cassette in preparation for use of the reticle in the exposure apparatus.

It is a sixth object of the present invention to provide a reticle keeping rack which is best suited to construct an unmanned and dustless production line for the manufacture of semiconductor devices.

Briefly, a reticle conveying apparatus according to an aspect of the present invention is arranged to convey a reticle cassette, containing a desired reticle, from a cassette library into an air-conditioned chamber in which a major assembly of a semiconductor device manufacturing exposure apparatus, a reticle inspecting device and others are accommodated, and also to extract the reticle out of the cassette having been moved into the chamber and to feed the reticle to the inspecting device for inspecting the presence/absence of dust or foreign particles on the reticle. Also, the reticle conveying apparatus is arranged to move the reticle, after inspection, to an exposure station defined in the main assembly of the exposure apparatus. The reticle conveying apparatus is further operable to move the demounted reticle back into its reticle cassette and to feed this cassette back to the cassette library.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 10 is an explanatory view for illustrating the principle of alignment by a reticle handling mechanism.

FIGS. 11A–11C are schematic views, respectively, for explicating examples of the manner of disposing the movable type cassette library in juxtaposition with peripheral equipments.

DESCRIPTION OF THE PREFERRED EMBODIMENTS

Figure 1:
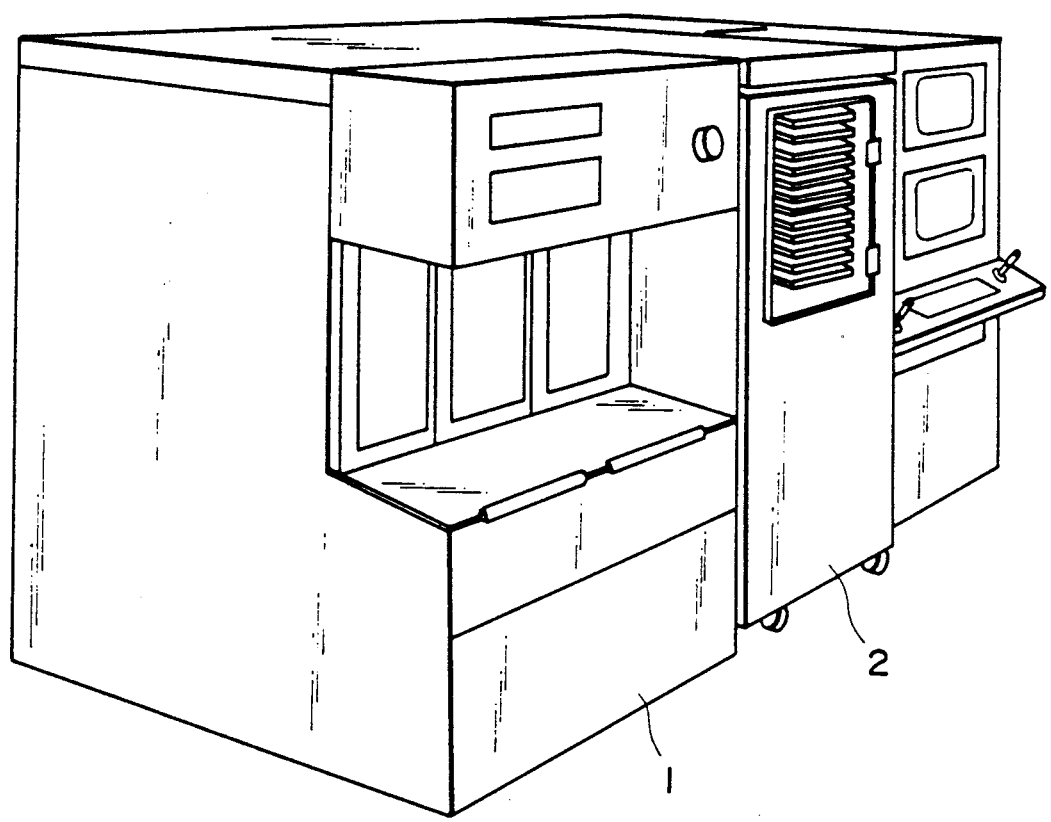
FIG. 1 is a perspective view showing an appearance of a projection exposure apparatus according to one embodiment of the present invention.

FIG. 1 generally shows an appearance of a reduction projection type exposure apparatus, called "stepper", according to one embodiment of the present invention. In FIG. 1, denoted generally at 1 is an air-conditioned chamber, and denoted at 2 is a movable type reticle cassette library.

Figure 2:
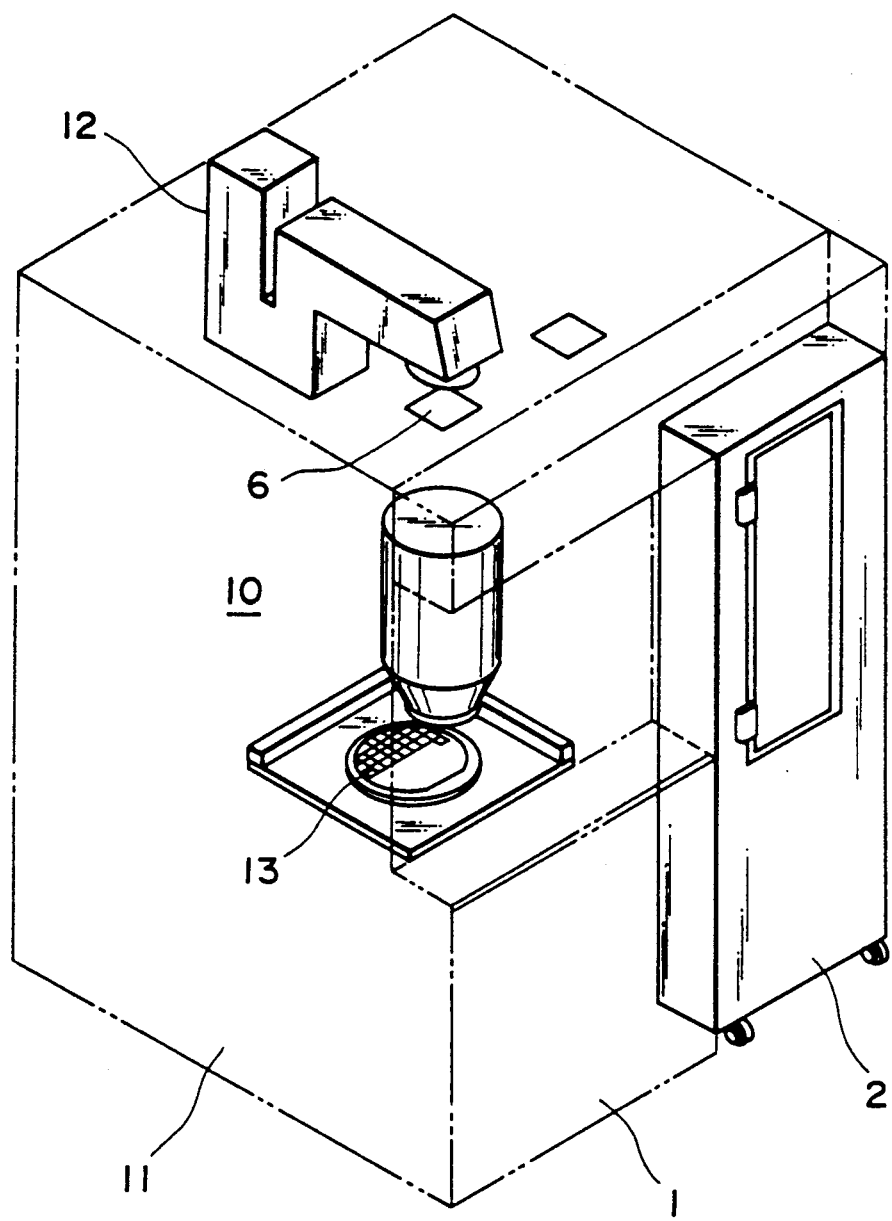
FIG. 2 is a perspective view showing a part of internal structure of the exposure apparatus of the FIG. 1 embodiment.

FIG. 2 is a perspective showing a part of a main assembly of the exposure apparatus accommodated in the chamber 1. In FIG. 2, denoted generally at 10 is the main assembly of the stepper which includes an imaging lens system 11 and an illumination device 12. Reference numeral 13 denotes a workpiece such as a semiconductor wafer upon which a pattern formed on a reticle 6 is photoprinted by means of a main assembly 10 of the stepper.

Figure 3:
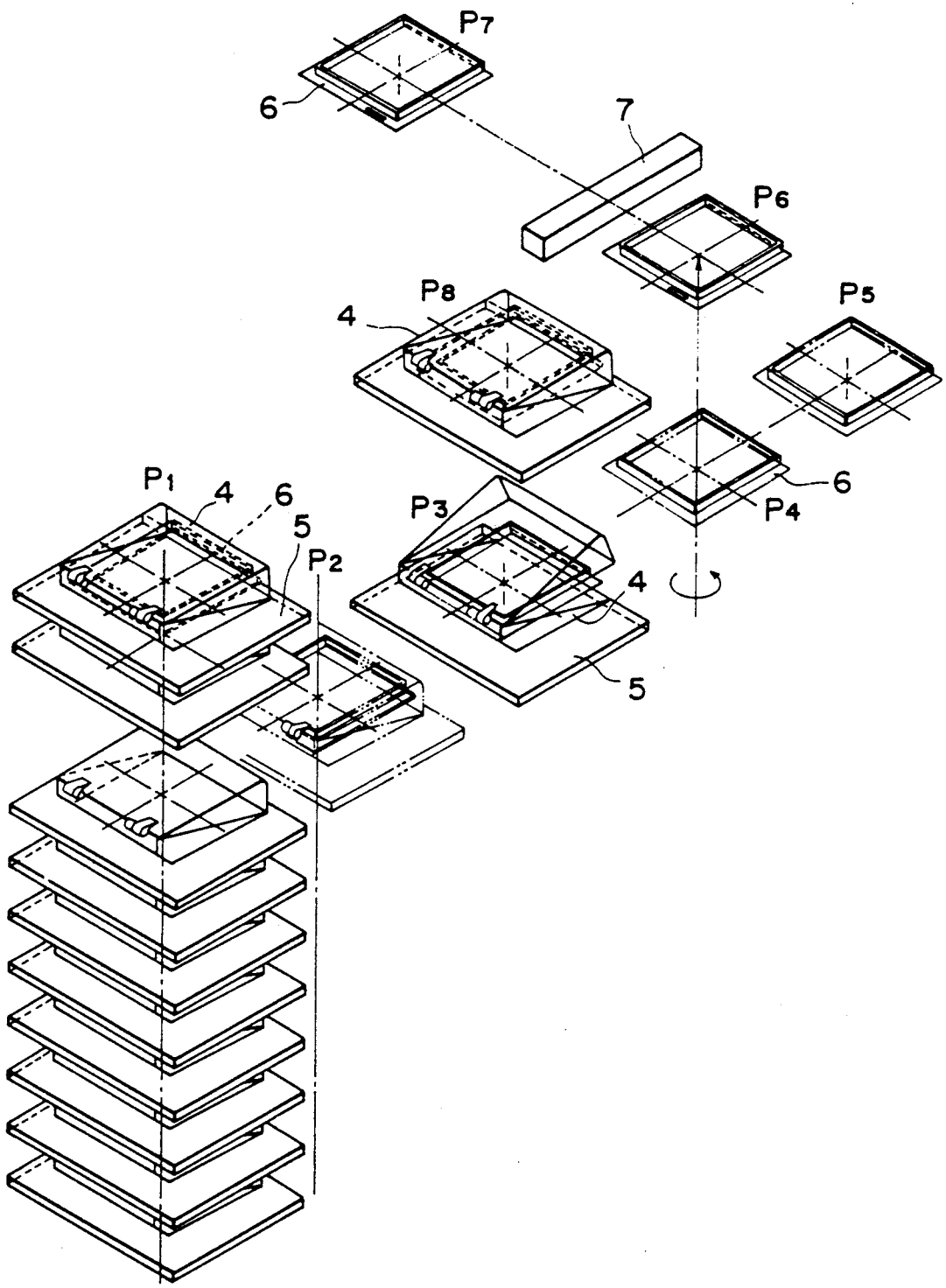
FIG. 3 is an explanatory view showing a reticle conveying system of the present invention.

FIG. 3 is an explanatory view showing a reticle conveying system according to an embodiment of the present invention. In FIG. 3, reference numerals 4—4 denote reticle cassettes or containers of the type disclosed in Japanese Laid-Open Patent Applications, Laid-Open Nos. 78084/1987 and 76531/1987. Reference numerals 5—5 denote cassette holders each for holding thereon a cassette 4. Each reticle cassette 4 is adapted to keep therein a reticle 6. Reference numeral 7 denotes a barcode reader which is operable also as a pattern position detecting device. Also, denoted generally at P1 in FIG. 3 is a first cassette keeping or storing station which corresponds to the position of the cassette library 2 shown in FIGS. 1 and 2. Further, denoted at P2 is an elevator station for lifting a cassette holder 5, extracted out of the cassette keeping station P1, to a predetermined position. Of course, a cassette holder 5 placed at the elevator station can be moved downwardly back to the cassette keeping station P1. Denoted at P3 in FIG. 3 is a reticle extracting station (a second cassette keeping station) at which a reticle 6 is extracted out of a cassette 4 having been moved to this station, together with the cassette holder 5, from the elevator station P2. The reference P4 denotes a reticle delivering station (a first delivering station) for delivering a reticle 6 to a mechanism operable to move the received reticle 6 upwardly. The reference P5 denotes an inspecting station for inspecting the presence/absence of foreign particles on a reticle supplied thereto. The reference P6 denotes a reticle delivering station (a second delivering station) for delivering a reticle 6 to a mechanism which is operable to convey a reticle 6 to an exposure station P7 and also to convey the reticle, placed at the exposure station, back to the second delivering station. The reference P8 denotes a vacant cassette stand-by station at which a vacant cassette 4 is placed, waiting to receive a corresponding reticle 6 being used in an exposure process at the exposure station P7.

A plurality of reticle cassettes 4—4 are kept in the reticle cassette library 2 (the first cassette keeping station P1) in a layered fashion. In response to an instruction signal supplied from a console included in the main assembly of the exposure apparatus, an elevator mechanism (not shown in FIG. 3) is actuated to come to a desired reticle cassette 4. By this elevator mechanism, the desired reticle cassette 4 is extracted, together with its holder 5, out of the cassette keeping station P1 and moved to the elevator station P2. At this elevator station, the extracted reticle cassette 4 as well as its holder 5 are elevated to a predetermined height and, thereafter, they are moved into and kept at the reticle extracting station P3 (the second cassette keeping station). As the reticle cassette 4 and its holder 5 are placed at the second cassette keeping station P3, a cassette opening and closing drive source (not shown) which is provided at the second cassette keeping station P3 is actuated to open the cassette 4 so as to allow extraction of a reticle 6 accommodated therein. In this open state, as a consequence of the shapes of an upper member (lid) and a lower member (tray) of the cassette 4, it is possible to detect, in a transverse direction of the cassette 4, the presence/absence of the reticle 6 in the cassette.

Subsequently, a reticle extracting mechanism (not shown) is actuated and extracts the reticle 6 out of the cassette 4 which is open at the reticle extracting station P3. The extracted reticle 6 is moved by way of the first delivering station P4 to the inspecting station P5. At this inspecting station, the reticle is moved by means of the above-described extracting mechanism so as to be scanned with an inspecting light supplied from an unshown light source for the inspection of any foreign particle on the reticle. As a result of such scan of the reticle 6, the presence/absence of any foreign particle on the reticle 6 as well as the location of such foreign particle, if any, are detected. If, in this stage, the reticle 6 having been inspected is discriminated as being unusable, it is moved back to the reticle cassette library 2 by means of the above-described operations made inversely.

If, as a result of the inspection at the inspecting station P5, a reticle 6 is discriminated as being usable for the exposure process, it is moved back to the first delivering station P4. At this station, the reticle 6 is delivered to a vertically conveying mechanism, not shown in FIG. 3, which has been placed at a slightly lower position. By this conveying mechanism, the reticle 6 is moved upwardly to the second delivering station P6.

At the second delivering station P6, the reticle 6 is delivered to the aforementioned mechanism which is arranged to move the reticle into innermost portion of the exposure apparatus. Thus, the reticle 6 is conveyed to the exposure station P7. During this conveyance, the bar-code reader or pattern position detecting device 7 operates to scan the reticle 6 being conveyed and detects the position of the pattern formed on the reticle 6 with respect to an end face (leading end) of the reticle. Namely, the pattern position detecting device 7 detects the positional deviation of the pattern formed on the reticle 6 with respect to the end face of the reticle. At the same time, the device 7 functions to read a bar code pattern recorded on the reticle thereby to detect various conditions set with respect to the exposure process related to this reticle. The data corresponding to the thus detected exposure conditions is supplied to the console of the main assembly of the exposure apparatus, such that the mechanical setting in relation to the exposure process using that reticle can be finished before the reticle 6 arrives at the exposure station P7.

On the other hand, the cassette 4 whose reticle 6 has been extracted at the second cassette keeping station P3 is closed by means of the aforementioned opening/closing mechanism and, thereafter, is moved to the reticle receiving station P8 during the vertical conveyance and forward conveyance of the reticle 6 to the exposure station P7. Thus, the cassette 4 is placed at the reticle receiving station P8 and waits for the reticle 6 coming thereto after the completion of the exposure process.

A reticle 6, after completion of the exposure process using the same, is conveyed to the second delivering station P6 by means of the aforementioned reticle supplying mechanism and is delivered to a reticle collecting mechanism which is in a stand-by state at this station. Then, the aforementioned cassette opening/closing mechanism drive source provided at the reticle receiving station P8 is actuated to open a cassette 4 placed at the reticle receiving station P8. After the cassette 4 is opened, the reticle 6 is introduced into the cassette 4 by means of the reticle collecting mechanism. Subsequently, the opening/closing mechanism operates again to close the cassette 4.

The cassette 4 now containing the reticle 6 is moved back to the reticle extracting station P3 by means of a cassette exchanging mechanism (which will be described later), such that it is handled by the elevator mechanism which has been positioned at the station P3 in a stand-by state. By this elevator mechanism, the cassette 4 is moved by way of the elevator station P2 back to the first cassette keeping station P1 within the reticle cassette library 2.

The aforementioned cassette exchanging mechanism is arranged to keep therein two cassettes at the same time. Accordingly, with the preparatory designation of a cassette that contains a reticle which should be used subsequently, it is possible to complete the inspection of such a subsequent reticle at the station P5 and to place the same at the first reticle delivering station P4 before a reticle being used in the current exposure process comes back to the second reticle delivering station. As a consequence, the subsequent reticle can be supplied to the exposure station P7 immediately after the current reticle is ejected from the second delivering station P6 into a vacant cassette which is waiting at the reticle receiving station P8.

In conventional type automatic reticle changing apparatuses, as described hereinbefore, a reticle is extracted out of a cassette which is held in a cassette library, so that only the reticle is conveyed along a long path to the exposure station and is moved back to the cassette along the same path. This cause a high probability of adhesion of dust or foreign particles to the reticle during its conveyance. Particularly, in a stepper type exposure apparatus wherein images of the same pattern of a reticle are photoprinted in sequence upon plural and different portions of one wafer, an image of such a foreign particle is also photoprinted upon each shot area or each chip. Therefore, the fraction defective increases extraordinarily. Such serious inconvenience is avoided by the present embodiment wherein, as described, each reticle 6 is conveyed while being kept in a corresponding cassette 4, between the cassette library 2 (the first cassette keeping station P1) and the reticle extracting station P3 of the air-conditioned chamber 1 or the cassette waiting station P8.

Figure 4:
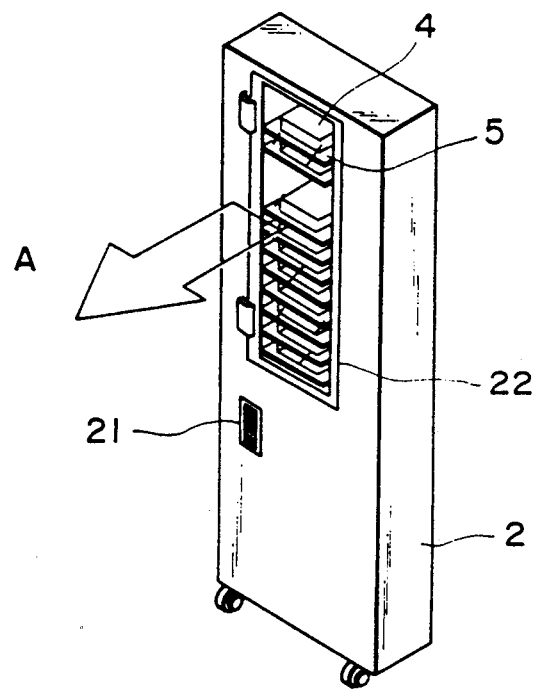
FIG. 4 is a perspective view showing an appearance of a back side of a movable type cassette library used in the FIG. 1 apparatus.

FIG. 4 shows an appearance of the movable type cassette library 2, of the FIG. 1 embodiment, as viewed from the back of it. Namely, FIG. 4 shows the appearance at the side from which each reticle cassette 4 is introduced together with its cassette holder 5 into the exposure apparatus by the automatic reticle changing system. In FIG. 4, the cassette library 2 has a frame member on which suitable data storing means 21 is mounted. The data storing means 21 includes a readable and writeable memory in which various data such as the titles of the cassettes kept in the library 2, the parameters denoting the specifications of the reticles contained in the cassettes and so on. Reference numeral 22 denotes a door of a cassette storing portion of the library 2. Such a door is provided on each of the front and back sides of the frame of the library 2.

An arrow A in FIG. 4 denotes the direction of extraction of each reticle cassette by the automatic reticle changing system.

The movable type cassette library of the present embodiment is made to be easily coupled to and detached from the air-conditioned chamber 1 or the main assembly of the stepper. Also, it is arranged so as to have a good interchangeability with other cassette libraries or a good compatibility with other peripheral equipments for handing reticles. Also, the library 2 is made movable by rotatable rolls which movably support the housing of the library. Thus, a suitable number of cassette libraries 2 each containing a predetermined number of reticle cassettes can be used sequentially and interchangingly in accordance with the process or the type of the semiconductor device to be manufactured.

This allows easy change in reticles in the unit of a cassette library containing many varieties of reticles, and the change of libraries itself can be made in an on-line fashion or the like. Thus, it is easily possible to construct a production line for short-run jobs. Further, according to the present embodiment and for the exchange of reticle cassettes to be supplied into the exposure apparatus, there is no necessity of such a manual operation for opening a window of a thermo-controlled chamber to allow the change of reticle cassettes after the exposure apparatus is thermally stabilized by the thermo-controlled chamber. Accordingly, with the present embodiment, it is possible to prevent an unpreferable temperature change in the exposure apparatus or the thermo-controlled chamber which might otherwise be caused by the manual cassette changing operation.

Also, the above-described arrangement of the reticle cassette library of the present embodiment allows easy connection of the same with various peripheral equipments provided for the maintenance of reticles. For example, as shown in FIGS. 11A–11C, the reticle cassette library 2 can be easily coupled to a pattern generator 1a (FIG. 11A), a stand-along type foreign-particle inspecting machine 1b (FIG. 11B), a reticle cleaning apparatus 1c (FIG. 11C), a pellicle applying apparatus (not shown), etc. Thus, the replacement of reticles and the maintenance or inspection of each reticle can be carried out without a manual labor of an operator.

Referring back to FIG. 4, the data storing means 21 comprises one or more writeable and erasable memories having recorded therein various data concerning the titles of reticles which are kept in reticle cassettes stored in the library 2, the positions of these reticles within the library 2 as well as parameters necessary for conducting the operation of the apparatus such as, for example, the conditions which should be set at the initial setting of the stepper in relation to a reticle just going to be used. The data storing means 21 is made operationally connectable with a suitable reading means provided on the air-conditioned chamber 1 or the main assembly of the stepper. By operationally connecting such reading means with the data storing means 21, various data such as the aforementioned parameters are supplied into the console 3 of the main assembly of the stepper.

Figure 5:
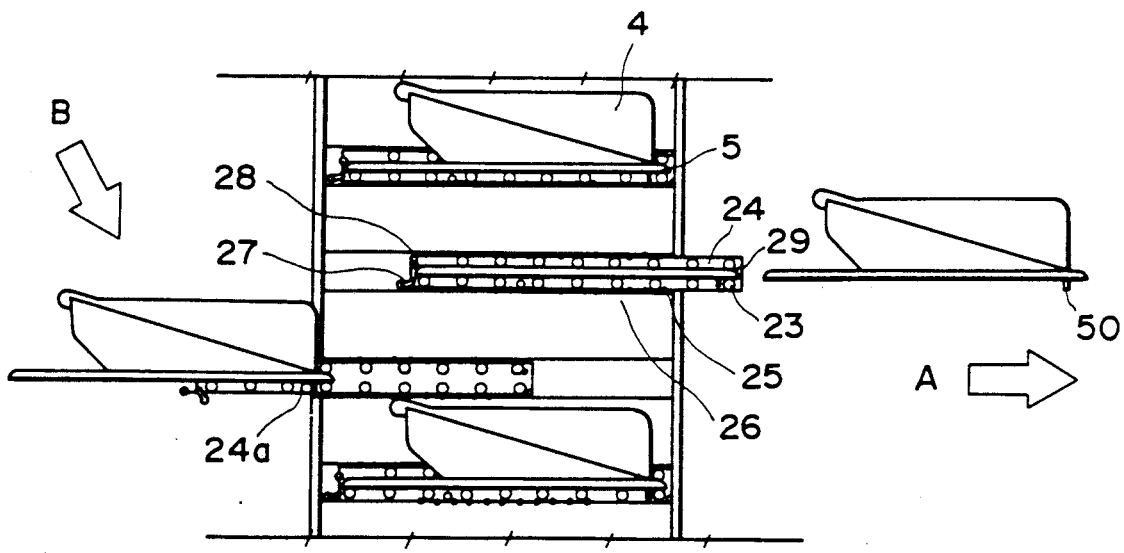
FIG. 5 is a sectional view showing the internal structure of the cassette library of FIG. 4.

FIG. 5 shows the state of keeping the cassette holders 5 in the library 2 and illustrates the manner of an automatic operation (denoted by an arrow A) and a manual operation (denoted by an arrow B) for the introduction/extraction of the cassette holders 5 into/from the library 2. In FIG. 5, reference numeral 4 denotes a reticle cassette while reference numeral 5 denotes a cassette holder, both of which are those described hereinbefore. An arrangement for detachably holding each cassette holder 5 includes arrays of rolls 23 and 25; a movable frame 24 for supporting the roll arrays 23 and 25; a library housing portion 26 which functions also as a guide rail; a stopper mechanism 27 mounted on the frame 24 and operable to prevent jounce of the cassette holder 5 within the library; a roll 28; and a stopper 29 operable to hold the cassette holder 5 between the roll arrays. Each of the multiple stages of the cassette library 2 is provided with such an arrangement as described above on each of the left-hand and right-hand sides thereof.

As for the moving direction and the moving stroke for each cassette holder 5 in the library 2, it will be understood that, in order to allow manual setting of each cassette by an operator as depicted by the arrow B and also to allow automatic extraction/insertion of each cassette by the automatic conveying system as depicted by the arrow A, it is necessary to provide a distance corresponding to the length of the holder 5 on the front side (left-hand side as viewed in FIG. 5) of the library 2 and also to define such a distance or stroke on the back side (right-hand side as viewed in FIG. 5) of the library 2 that is sufficient to allow extraction/insertion of the holder 5. Also, since the library 2 is arranged to be easily coupled to and demounted from the air-conditioned chamber 1 or the main assembly of the stepper, any actuator which functions as a drive source for moving the holder 5 is not provided in the library in accordance with the present embodiment. Thus, the extraction and insertion of each holder 5 from and into the library 2 is carried out manually or by means of a drive transmitted from a drive source, not shown, of the automatic conveying system.

The second stage, from the above, of the library 2 shown in FIG. 5 is in a state in which the cassette holder 5 has been extracted out of the library 2. When an elevator mechanism, not shown, of the automatic conveying system is opposed to the position of a desired cassette holder 5, an actuator of the elevator mechanism is actuated to engage with the stopper 29 and, thereafter, to draw the frame 24 to the illustrated position. After this, the stopper 29 is released. Subsequently, a drawing hook provided on the elevator mechanism is actuated to engage with a pawl 5a formed on the cassette holder 5, so that the holder 5 is drawn to the illustrated position. By this, the cassette holder 5 is extracted out of the library 2.

In the illustrated state of the second stage of the library, wherein the holder 5 has been extracted, the stopper mechanism 27 is being supported by the rail 26, as shown in FIG. 5. Therefore, when the holder 5 comes back to the library, it functions as a stopper for the holder 5. As a consequence, the cassette holder 5 can be kept or held stably at a constant position with respect to the frame 24 having the roll arrays 23 and 25.

The third stage, from the above, of the library 2 shown in FIG. 5 is in a state for the manual cassette exchange. In this state, the stopper mechanism 27 is disengaged from the supporting rail 26, so that it is in a released state. Also, a cassette holder 5, which has been kept on the third stage in the library and which is being moved outwardly of the library, is stopped by the engagement of its pawl 5a with a stopper member 24a fixedly provided on the frame 24. Therefore, the replacement of the cassette from the direction of the allow B is easily attainable.

Figure 6:
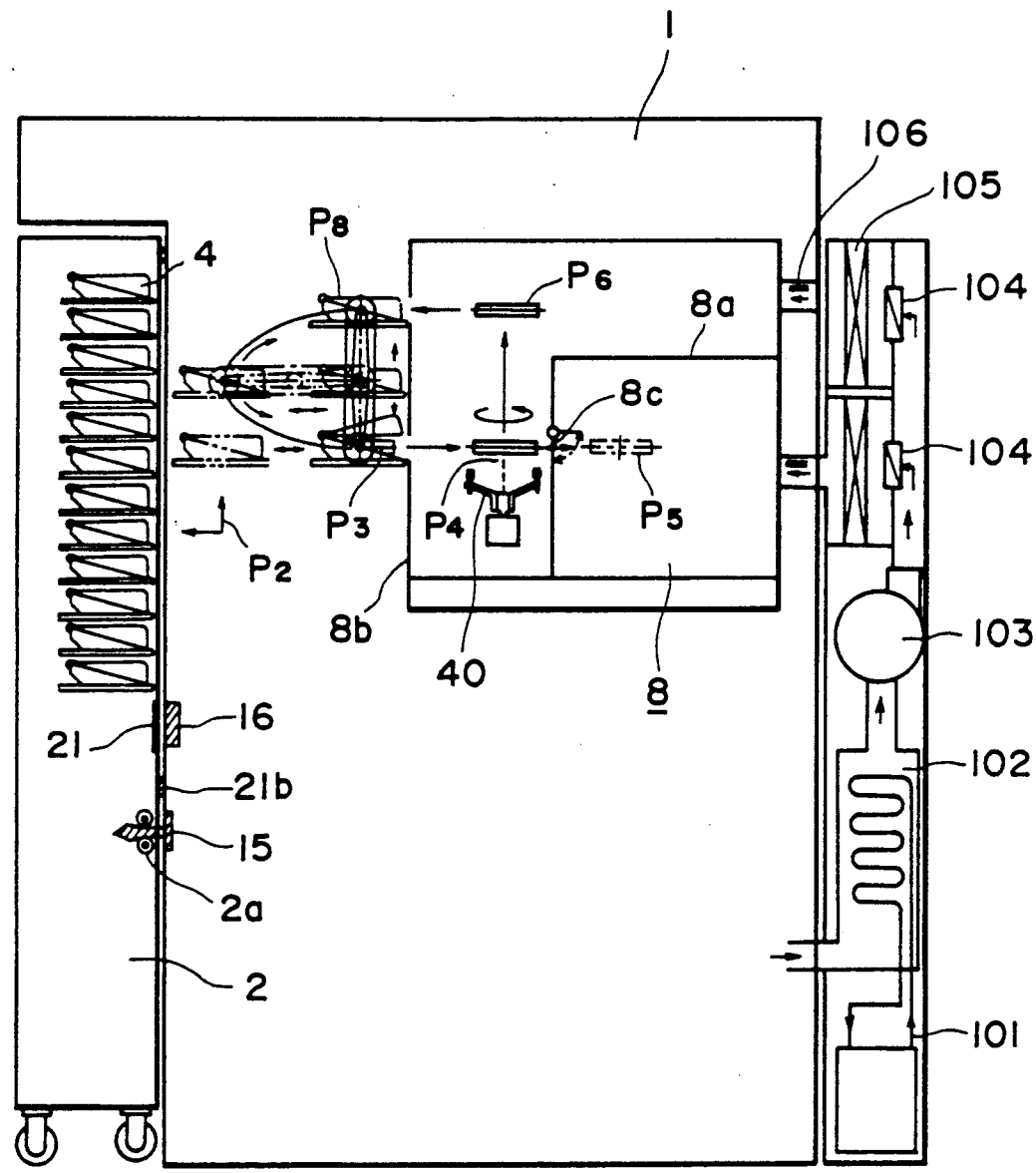
FIG. 6 is an illustration explicating the operation of the reticle conveying system of the present invention and as viewed from the right-hand side of the apparatus.

FIG. 6 is an explanatory view of the exposure apparatus, shown in FIG. 2, as viewed from the right-hand side of the apparatus.

In FIG. 6, the reticle cassette library 2 is coupled to the air-conditioned chamber 1 of the exposure apparatus. In this state, a locking member 15 provided on the chamber 1 side engages with engaging rolls 2a provided on the library 2 side, whereby the relative position of the chamber 1 and the library 2 is fixed. The data having been stored in the data storing means 21 provided on the reticle cassette library 2 is 5 read by a reading means 16 provided on the chamber 1 of the exposure apparatus, whereby various data concerning the positions of reticles kept in the library 2, the parameters related to the processes using these reticles, and so on are supplied into the main assembly of the exposure apparatus. These data are stored into a storing means included in the main assembly of the apparatus.

A reticle having been extracted out of the library in accordance with the designation made at the main assembly side is placed on the elevator mechanism at the elevator station P2 and is moved to the second cassette keeping station P3. This station is defined at the middle position with respect to the height of the reticle cassette library. This arrangement is adopted in order to minimize, for different cassettes held at different positions in the library 2, the difference in the time for conveyance due to the difference in the cassette position with respect to the height of the library 2. If, on the other hand, it is desired to manually set a reticle cassette 4 without use of the reticle cassette library 2, it is desirable to directly place the cassette on the reticle extracting station P3. Since, in the present embodiment, the reticle extracting station P3 is defined at a height of about 1.20 meter from the floor on which the exposure apparatus stands, such a manual cassette setting by an operator is very easy.

The most important point aimed in the mechanisms and functions of the present embodiment is the prevention of adhesion of foreign particles to a reticle during conveyance thereof. Particularly, in the present embodiment, in order to prevent adhesion of floating particles to a "bare" reticle during its conveyance, each of the space for the foreign-particle inspecting station 8 and the reticle conveying space through which each reticle extracted out of its reticle keeping cassette is conveyed is enclosed by a "clean box". To assure this, there are provided an inner box 8a for accommodating the inspecting station 8, an outer box 8b for accommodating the inner box 8a and enclosing the space through which each bare reticle is conveyed, a door 8c for selectively closing an entrance or opening of the inner box 8a, and an air-conditioning system for the inner and outer boxes. Further, in order to fully prevent floating particles and such particles that have been produced by the cassette exchanging mechanism and/or the cassette opening and closing mechanism from entering into the interior of the reticle conveying space. The pressure in the chamber is increased in a specific manner. Namely, a differential pressure is set in the manner that the space for the inspecting station 8 (i.e. the space within the box 8a) has a highest pressure while a decreasing pressure is set outside the box 8a which pressure decreases in an order of the reticle conveying space (the space in the box 8b), the interior of the chamber 1 (the space surrounding the box 8b) and the exterior of the chamber 1. In the illustration of FIG. 6, the door 8c is provided to intercept the flow of flowing particles from the reticle conveying space in the box 8b into the reticle inspecting unit 8 in the box 8a. Also, as illustrated, there are provided an air-conditioning unit 101, a cooling device 102, a blower 103, heating devices 104, filters 105 and temperature sensors 106. Denoted at 21b are seal members.

Figure 7:
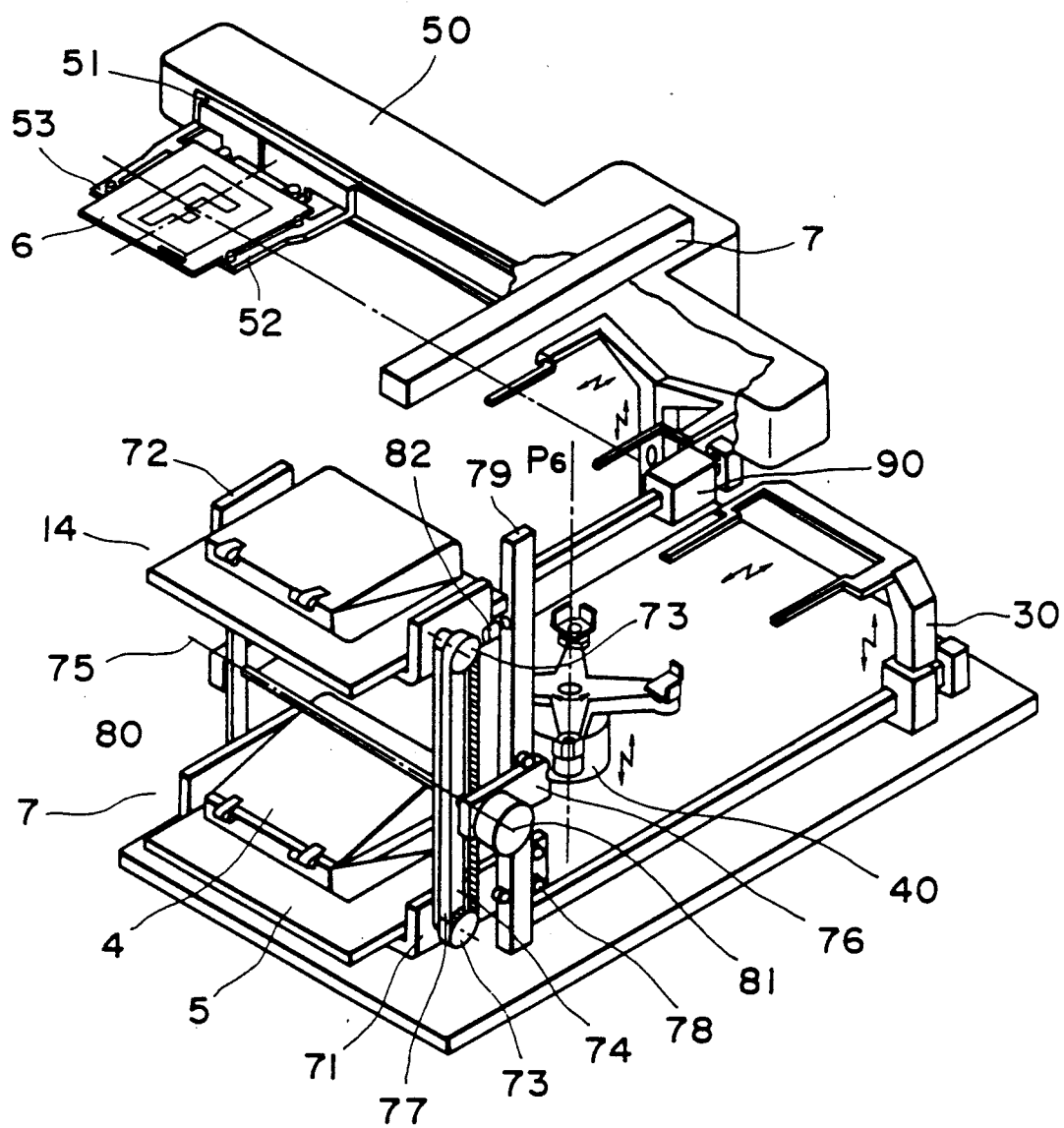
FIG. 7 is a perspective view showing mechanisms provided at a reticle extracting station and a reticle keeping station within the apparatus.

FIG. 7 is a partially broken-away perspective view which shows a portion of the basic structure, shown in FIG. 3, including operational mechanisms from the reticle extracting station P3 to the reticle receiving station P8 fixedly provided on the exposure apparatus.

In FIG. 7, a cassette 4 having been extracted, together with its holder 5, out of the cassette library 2 is conveyed to the reticle extracting station (the second cassette keeping station) P3 and is placed on and held by a holder support or table 71 which is movable upwardly and downwardly. At the station P3, there is provided a cassette opening and closing mechanism, described hereinbefore, operable to separate an upper member (lid) and a lower member (tray) of a cassette 4 from each other. After a holder 5 is placed on and held by the holder support 71 (this may be detected by suitable means), the cassette opening and closing mechanism is actuated to open the upper member (lid) of a cassette 4 carried by the holder 5, thereby to allow extraction of a reticle 6 contained in the cassette 4. Then, a reticle extracting fork 30 operates to extract the reticle 6 out of the cassette 4 and to move, at a constant speed, the extracted reticle 6 into the reticle inspecting unit 8 (FIG. 6) which is positioned at the extension of the reticle extracting direction. On the other hand, after the reticle 6 is extracted out of the cassette 4 (this may be detected by suitable means), the cassette opening and closing mechanism operates again to close the cassette 4.

The holder supporting means provided at the reticle extracting station P3 includes the vertically movable type holder support or table 71 described hereinbefore and an attitude retaining type holder support or table 72 which are arrayed in a vertical direction. The cassette exchanging mechanism including this holder supporting means is arranged such that, after the vacancy of a cassette 4 which is placed on the holder support 71 is detected and the cassette is closed, the vertically movable type holder support 71 which is at a lower position in the FIG. 7 state and the attitude retaining type holder support 72 which is at an upper position in the FIG. 7 state are moved so as to interchange their positions with respect to the vertical direction. By this, aforementioned vacant cassette 4 is moved to the upper position (reticle receiving station P8) and it is held at this position (station P8) until the corresponding reticle having been conveyed to the exposure station P7 comes back to this position (station P8) after the completion of the exposure process.

Referring back to FIG. 6, a reticle 6 extracted out of a corresponding cassette 4 is usually conveyed into the reticle inspecting unit 8. However, in a case where such a reticle 6 is provided with one or more pellicle protecting film, it is not always possible to inspect the whole surface of the reticle due to the existence of a frame member for the pellicle protecting film. Since the reticle is covered by the pellicle protecting film supported by the frame member, it is difficult to inspect such region of the reticle 6 that is adjacent to a corner at which the reticle 6 adjoins the pellicle frame. In order to execute the inspection of such a region, means is provided in the present embodiment so as to rotate each reticle 6 in a horizontal plane by 180 degrees and, after the rotation, the reticle is moved again into the reticle inspecting unit 8 for the inspection of that region. The function of rotating the reticle in a horizontal plane is provided a rotationally and vertically moving mechanism 40 (hereinafter "$\theta$-Z mechanism") disposed at the delivering station P4.

Referring back to FIG. 7, when a reticle 6 having been subjected to the inspection by the reticle inspecting unit 8 comes back to the delivering station P4, the $\theta$-Z mechanism 40 operates to move upwardly from the underneath of the reticle extracting fork 30 thereby to lift up the reticle 6 from the fork 30. Further, the $\theta$-Z mechanism 40 operates to rotationally move the reticle in the $\theta$ direction to adjust the rotational position of the reticle in accordance with the reticle setting direction at the exposure station. Also, by the upwardly moving operation of a Z-axis moving portion of the mechanism, the $\theta$-Z mechanism 40 conveys the reticle to the delivering station P6.

The amount of reticle rotation by the $\theta$-Z mechanism 40 can be set on the basis of the designation from the console or in accordance with the data read out from the storing means 2. The rotation can be preset for each reticle at a pitch of one-fourth ($\frac{1}{4}$) revolution, and the rotation of a maximum three-fourth ($\frac{3}{4}$) revolution can be set. Thus, the provision of this $\theta$-Z mechanism permits easy and positive transfer of each reticle between a reticle cassette and any reticle handling apparatus (e.g. an exposure apparatus, an inspecting apparatus, etc.) in an unmanned and on-line fashion without the necessity of a cumbersome and unpreferable manual and preparatory orientation of the reticle in its reticle cassette and, therefore, with retaining the cleanness of the reticle and in the reticle cassette. As a consequence, the "machine compatibility" can be improved while maintaining a high degree of cleanness.

The reticle conveying mechanism denoted generally at 50 in FIG. 7 includes a reticle conveying hand 51 having reticle grasping fingers 52 and 53 mounted for opening and closing movement. At the station P6, the reticle conveying hand 51 waits for a reticle 6 with its fingers 52 and 53 opened. When the reticle is transferred to the station P6, the hand 51 receives the reticle while adjusting its position and supporting it from the lower side thereof. The hand 51 to which the reticle 6 is transferred at the delivering station P6 conveys the reticle along a rectilinear path to the exposure station P7 within the exposure apparatus. During the conveyance, the hand 51 supports the lower face of the reticle 6 with each finger 52 or 53 abutting against two orthogonally extending end faces of the reticle. At a point on the way of this rectilinear conveyance path, a bar-code reader and pattern position detecting unit 7 is provided. Thus, during a time period during which the reticle 6 is conveyed at a constant speed, a unit 7 is used to conduct the confirmation the identity of the reticle, the reading of the parameters to be set in the exposure apparatus in relation to the reticle and the detection of any positional error of the pattern of the reticle 6, being grasped by the hand, with respect to the center of the exposure station. Accordingly, the setting of conditions in the exposure apparatus can be accomplished before the conveyance of the reticle is completed.

When the reticle conveying hand 51 arrives at the exposure station P7, the fingers 52 and 53 of the hand 51 are opened to release the reticle 6 at this position, whereby the reticle 6 is placed on a table (not shown) of the exposure apparatus. After this, the reticle conveying hand 51 waits at the exposure station P7 for the completion of the exposure process with its fingers 52 and 53 maintained open.

The reticle 6 having completed the exposure process is conveyed from the exposure station P7 to the delivering station P6 by the reticle conveying hand 51. At the delivering station P, the above-described $\theta$-Z mechanism 40 has been moved downwardly to the lower initial position while a reticle collecting fork 90, provided at this station, has prepared for the reticle collection.

When, at the delivering station P6, the reticle conveying hand 51 transfers the reticle 6 onto the collecting fork 90, the fingers 52 and 53 of the hand 51 are opened. As a consequence, the collecting fork 90 now can operate to store the reticle into a vacant reticle cassette, waiting at the above-described reticle receiving station P8, without any interference between the elements of the mechanisms 51 and 90.

At the reticle receiving station P8, also, there is provided a cassette opening and closing mechanism and drive source which is similar as that provided at the reticle extracting station P3. By the operation of such cassette opening and closing mechanism, the cassette 4 which is waiting at the station P8 is opened. After the vacancy of the cassette 4 is confirmed, the collecting fork 90 is actuated to store the reticle 6 into the cassette 4. After completion of the reticle storing and when the collecting fork 90 moves out of the cassette 4, the cassette opening and closing mechanism is actuated to close the cassette 4.

Subsequently, the above-described holder supporting means operates again to interchange the positions of the two holder supports in the vertical direction, whereby the cassette 4 now containing its reticle 6 is moved to the lower position (the reticle extracting station P3) at which the cassette 4 waits for the subsequent cassette collecting operation.

The cassette 4 moved back to the reticle extracting station P3 is conveyed back to the reticle cassette library 2 by means of the cassette conveying mechanism.

If all the above-described operations, including the operation of the cassette conveying mechanism, the reticle extracting operation, the reticle inspecting operation, the operation of the $\theta$-Z mechanism, the reticle conveying operation, the reticle collecting operation, the cassette exchanging operation for interchanging the positions of upper and lower cassettes and the operations for storing or supplying a cassette into the library, are executed in series or in sequence, it disadvantageously takes a long time of an order of three to four minutes to change reticles for each exposure process. In the present embodiment, as compared therewith, two holder supports such as at 71 and 72 are provided at the second cassette keeping station. A cassette 4 extracted out of the cassette library 2 is subjected to the reticle extracting operation at the reticle extracting station P3 by means of the reticle extracting fork 30, whereby the cassette is vacated. Thereafter, the upper member (lid) of the cassette is closed and the cassette is conveyed to the reticle receiving station P8 by means of the cassette position exchanging operation in the vertical direction. By this, the attitude retaining type holder support such as at 72 is placed at the reticle extracting station P3. Thus, it is possible to convey and place, to and on this attitude retaining type holder support 72, a next reticle cassette in which a reticle required for the subsequent exposure process is kept. From this, it will be readily appreciated that, in the present embodiment, the next reticle to be used for the subsequent exposure process can be preparatorily placed in a stand-by state on the θ-Z mechanism 40, only by (i) predicting, by calculation, the time for executing the reticle change on the basis of the time for accomplishing the current exposure process in the exposure apparatus or on the basis of the processing time necessary for processing (exposing) a predetermined number of wafers and (ii) initiating various operations necessary for conveying the next reticle while taking into account the time periods for mechanical operations such as, for example, the cassette conveying time, the reticle inspecting time, etc. Therefore, according to the present embodiment, the reticle changing time can be reduced remarkably. It is possible to reduce the reticle changing time to an order not greater than 30 sec., and this is attainable only by the addition of a sequential program for operating the conveying system so that, when a reticle having completed an exposure process is conveyed up to the reticle receiving station P8, the θ-Z mechanism 40 carrying a next reticle to be used for the subsequent exposure process is moved upwardly and arrives at the delivering station P6.

Figure 8:
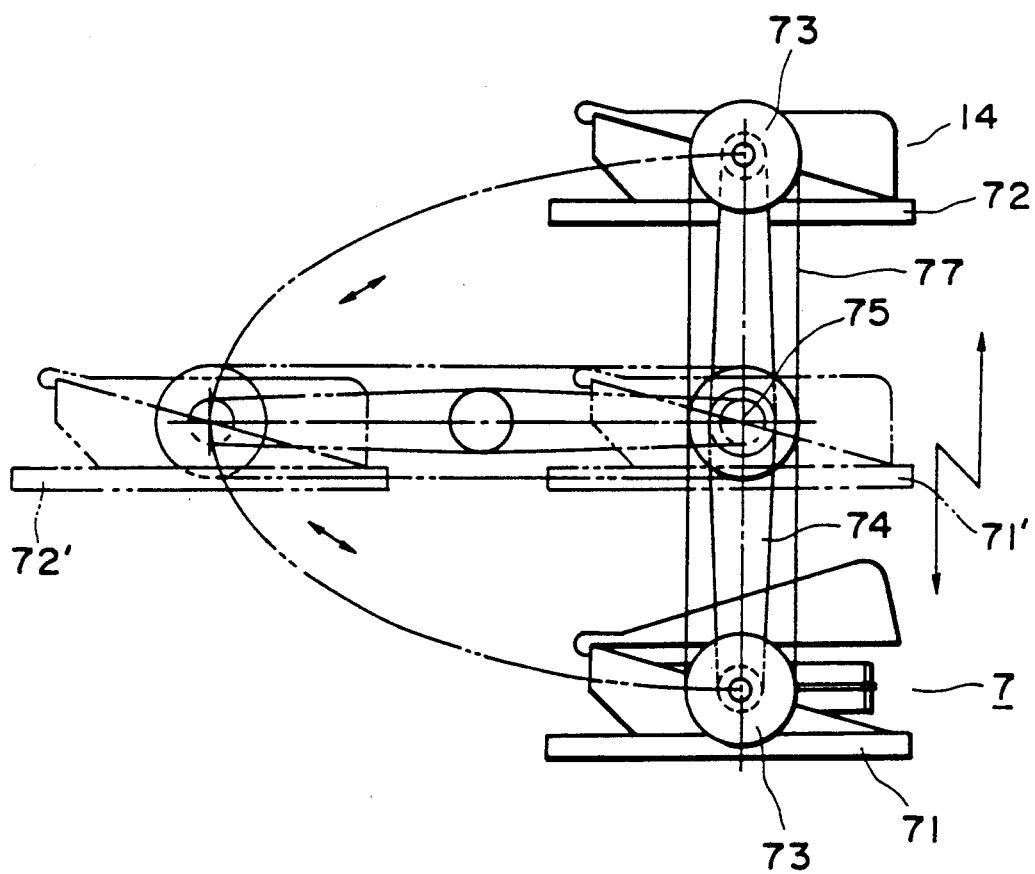
FIG. 8 is an explanatory view showing the manner of operation of a reticle cassette interchanging mechanism.

FIG. 8 is an explanatory view showing the operation of the cassette position exchanging mechanism 70 (FIG. 7). Details of the mechanism 70 will now be described, taken in conjunction with FIGS. 7 and 8.

In FIG. 8, denoted at numerals 71 and 72 are the holder supports described hereinbefore. There are provided pulleys 73-73 each mounted to the holder support 71 or 72. As is best seen in FIG. 8, an arm 74 is provided so as to rotatably support the shafts of the pulleys 73 and 73, mounted to the holder supports 71 and 72, while maintaining a predetermined interval between these shafts. The arm 74 itself is rotatably supported at an intermediate position 75 between the pulleys 73 and 73 by a horizontally operating slider 76. The upper and lower pulleys 73 and 73 shown in FIG. 8 are operationally coupled to each other by means of a belt 77. With this arrangement, the supporting arm 74 is rotatable about a center of rotation, denoted at 75, while on the other hand the holder supports 71 and 72 are movable to the upward and downward positions with the rotational movement of the arm 74 without changing their attitudes which are in a parallel relation. Of the two holder supports, the vertically movable type holder support 71 is confined by means of a vertical guide 79 and three rolls 78 supporting the guide 79, such that it is movable only vertically in the Z-axis direction while retaining the horizontal attitude thereof. The horizontally operable slider 76 is movable horizontally with the upward/downward movement of the holder support 71, while supporting the center 75 of the arm 74. Thus, the whole weight is supported at two points on the ends of a shaft 80. Reference numeral 81 denotes a rotary actuator for rotating the shaft 80, fixedly supporting the arm center 75, and therefore the arm 74 relative to the slider 76.

When, in the state of FIG. 7, a counterclockwise rotating drive (as viewed in FIG. 7) is applied to the arm 74, the holder support 71 is moved upwardly in the Z-axis direction with its attitude being supported horizontally. On the other hand, since the attitude of the holder support 71 is maintained horizontal, the holder support 72 means along an arcuate path about the shaft 80 with the motion of the pulleys 73 and 73 and the belt 77, with the attitude of the support 72 being supported similarly horizontally.

Since, however, the shaft 80 at this time is supported by the horizontally movable slider 76, the shaft 80 is displaced horizontally and leftwardly, as viewed in the drawing, with the movement of the holder support 71. As a result, the holder support 72 is moved while tracing a path, such as shown in FIG. 8, which is defined by the combination of the arcuate motion and the horizontal motion. Namely, if in FIG. 8 the arm 74 is rotated counterclockwise from the FIG. 7 position by an angle of 180 degrees, the holder support 71 is moved vertically and upwardly to the position denoted at 72 by way of the position denoted at 71'. At the same time, the other holder support 72 is swingably moved to the position denoted at 71 by way of the position denoted at 72'. By this, the positions of the holder supports 71 and 72 are interchanged. In order to move these holder supports back to their original positions, the arm 74 is rotated clockwise by 180 degrees.

In the end portion of the moving operation of the holder support 72, it moves substantially horizontally. Therefore, it is easily possible to move and hold the holder support 72 with the aid of a damper such as denoted at 82 in FIG. 7 and a suitable holding mechanism, not shown. It is to be noted that, due to the swingably motion of the holder support 71 about the shaft 80, the end portion of the motion of the holder support 71 in the vertical direction is decelerated significantly. Further, for the rotational motion of the arm 74 about the center of rotation of the shaft 80, the holder supports 71 and 72 provide a counterbalancing arrangement with respect to the shaft 80. As a result, the rotational motion does not require a great force.

Figure 9A:
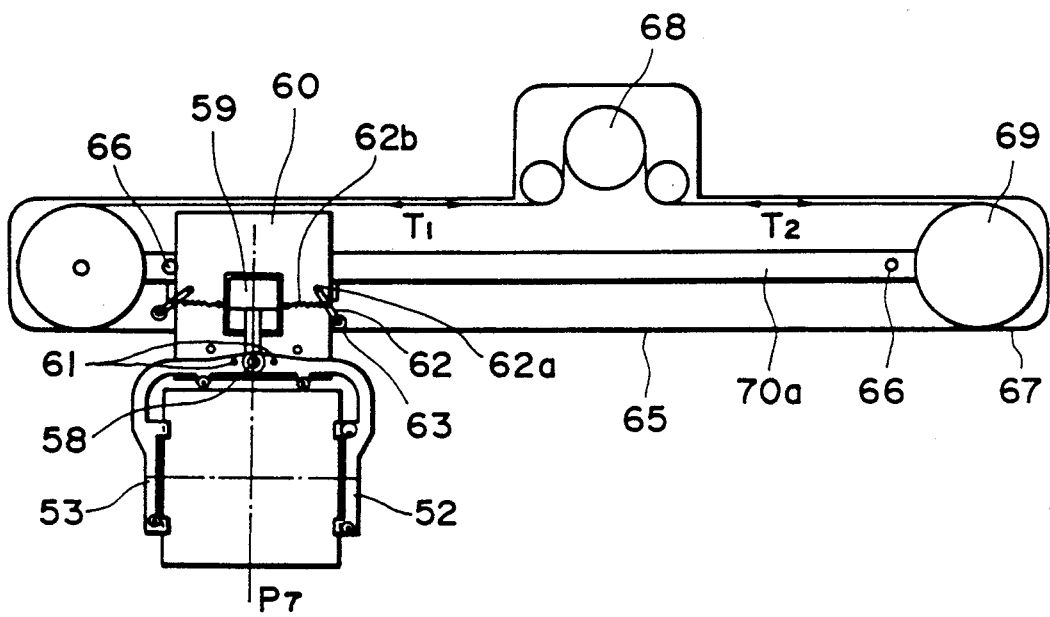
FIGS. 9A and 9B are explanatory views, respectively, showing a reticle feed-in mechanism.
Figure 9B:
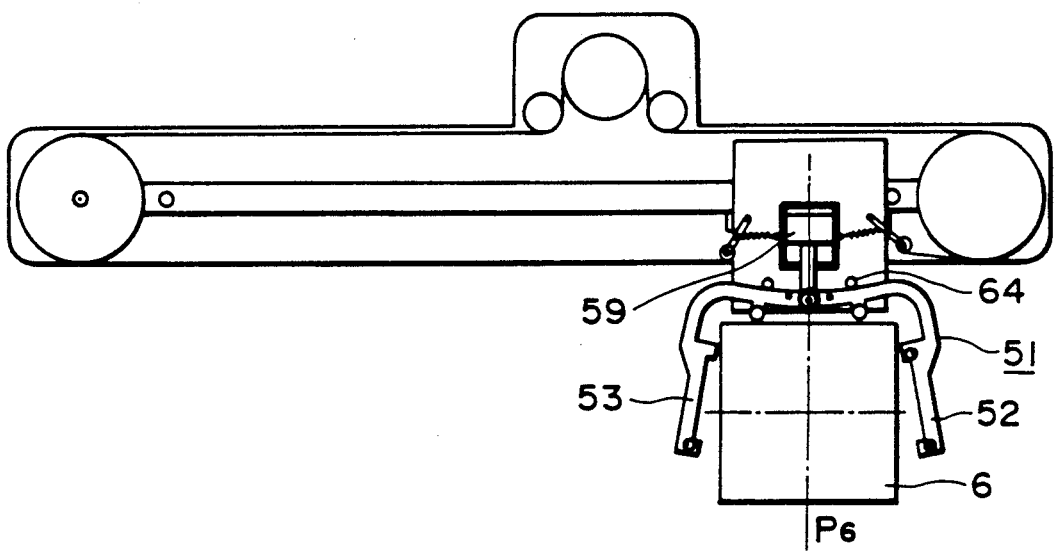

FIGS. 9A and 9B are explanatory views of the reticle feeding mechanism and, more particularly, FIG. 9A shows the state of the feeding mechanism in which a reticle grasped by the hand has been conveyed to the exposure station P7 while FIG. 9B shows the state of the mechanism in which a reticle is released at the second delivering station P6.

The reticle feeding mechanism includes the hand 51 (FIG. 7) which comprises swingable fingers 52 and 53. The finger 52 is provided with reference rolls for positioning a reticle with respect to the X and Y directions. The finger 53 is provided with a reference roll for positioning a reticle in the Y direction. There are provided an actuator 59 for opening and closing the fingers; a slider 60; rotational shafts 61; levers 62; rollers 63; rotational shafts 62a for the levers 62; springs 62b; a flat belt 65; stoppers 66 for the slider 60; an outer cover 67; a driving pulley 68; follower pulleys 69; and a guide rail 70a for the slider 60.

The flat belt 65 has opposite ends secured to the slider 60 and is stretched by way of the rollers 63 pivotably supported by the lever 62, respectively, about the rotational shafts 62a, respectively. To each lever 62, a tension force is applied by means of corresponding one of the springs 62b so as to avoid the slack of the belt 65. As seen in FIGS. 9A and 9B, these levers 62 and springs 62b as well as the rollers 63 are disposed on the left-hand and right-hand sides of the slider 60. The belt 65 extends around the left-hand and right-hand follower pulleys 69 and around the driving pulley 68. As shown in FIG. 9A, the slider 60 when it arrives at the exposure station P7 abuts against the left-hand side stopper 66 fixedly provided on the guide rail 70a. When, in this state, the driving pulley 68 rotates by a small amount, the tension T1 on the left-hand side as viewed in FIG. 9A increases so that the tension T2 on the right-hand side is relatively decreased. Thus, by the difference in tension "T1-T2", the slider 60 is pressed against the left-hand stopper 66. Since such a pressing force can be easily made stable, high positional reproducibility is attainable at the exposure station P7. The above-described principle applies to the positioning of the slider 60 at the right-hand stop position.

The outer cover 67 has a laterally extending window for allowing the sliding motion of the hand 51 (see FIG. 7), but the outer cover 67 covers the whole reticle feeding mechanism except for such sliding portion of the hand 51.

The flat belt 65 has a width sufficiently covering the thickness, in the height direction, of the sliding portion of the reticle conveying hand 51 (FIG. 9B). Accordingly, the above-described window of the outer cover 67 can be substantially closed by such portion or portions of the sliding flat belt 65 that are exposed to the outside through the window of the outer cover. In this manner, the whole reticle feeding mechanism except for the sliding portion of the hand 51 is kept in a substantially closed space.

Further, in this embodiment, the space within the outer cover 67, containing the sliding mechanism portion, is evacuated by suitable means, not shown, connected to a desired location within the space. By this, a "negative" pressure is established in this space. Thus, it is possible to prevent particles, produced by the sliding motion, from flowing out of the space. Therefore, undesirable adhesion of particles, produced by the reticle conveying mechanism, to a reticle being conveyed can be effectively avoided.

The reticle conveying hand 51, when it is moved to the second delivering station P6 such as shown in FIG. 9B, is pressed against the right-hand stopper in a similar manner as has been described. Thus, high positional reproducibility is attainable similarly at this stop position (the second delivering station P6).

At each stop position (P7 or P6), the actuator 59 operates to open or close the fingers of the hand 51. When the actuator 59 operates, its action point causes displacement of a coupling shaft 58 provided to couple the ends of the fingers. These fingers 52 and 53 themselves are lever members whose fulcrums are provided by the left-hand and right-hand rotational shafts 61 mounted on the slider 61, respectively. Also, these fingers are coupled to each other by means of the coupling shaft 58. Therefore, the displacement of the coupling shaft 58 toward the reticle is effective to establish an open state of the hand as illustrated in FIG. 9B. As a result, it is now possible to transfer the reticle between the hand and the θ-Z mechanism 40 or the reticle collecting fork 90.

FIG. 10 is a representation of the manner of positioning of a reticle by the hand 51 and illustrates the principle of aligning a reticle gripped by the hand.

In FIG. 10, the fingers 52 and 53 of the hand 51 are in a closed state having been established by the operation of the actuator 59. Denoted in FIG. 10 by numerals 54, 55 and 56 are rolls, two of which are provided on the finger 52 and one of which is provided on the finger 53. Generally, each reticle for use in the manufacture of semiconductor devices has a rectangular or square shape. Accordingly, by pressing the fingers against the reticle so that the peripheral surfaces of the rolls 55 and 56 engage with an end face of the reticle while the peripheral surface of the roll 54 engages with another end face of the reticle, the reticle can be aligned on the basis of its configuration.

Denoted at 57a–57a in FIG. 10 are eccentric rolls each having a center of rotation deviated from the center of roll. Each eccentric roll 57a has a high coefficient of friction at its outer peripheral surface. Further, these eccentric rolls 57a have springs which are incorporated so that opposite forces F1 and F2, as illustrated, are always applied to the rolls. When no reticle is gripped, the eccentric rolls rest at the positions denoted at 57a. When the hand is closed to grip a reticle, the finger 52 having the X-Y positioning reference rolls 54 and 55 and the finger 53 having the Y-axis positioning reference roll 56 are moved as denoted by arrows F—F, so that each finger applies a force F to the reticle. Also, each eccentric roll 57a provided on the finger 52 or 53 is rotationally moved such as depicted at 57b. At this time, the relation $F << F2 < F1$ is satisfied in the present embodiment. Further, at this time, the positions of the fingers 52 and 53 in the closed state are made unchangeable by the regulation of the moving stroke of the coupling shaft 58. By doing so, there are produced forces F1 and F2 as a result of the combination of (i) the actions of the eccentric rolls 57a, (ii) the coefficient of friction at the interface between the peripheral surface of each eccentric roll and the end face of the reticle and (iii) the force by which eccentric roll is urged back to the position depicted at 57a. The components of these forces F1 and F2 create reticle pressing forces fx, fy1 and fy2 at the outer peripheries of the rolls 54, 55 and 56. By these reticle pressing forces, end faces of the reticle are pressed so that the reticle being supported on the hand is aligned, on the basis of its end faces.

As described hereinbefore, the bar-code reader and pattern position detecting unit 7 is disposed on the way of the conveying path along which the thus gripped and aligned reticle is transferred from the delivering station P6 to the exposure station P7. With this detecting unit 7, the position of the pattern of the reticle being conveyed can be measured. On the basis of this measurement, the spacing or distance of the pattern position from the aligned end face of the reticle substrate can be detected. The result of such detection is usable as the data for the mechanical setting in the main assembly the exposure apparatus, so that any error caused in the manufacture of that reticle can be compensated for.

While the invention has been described with reference to the structures disclosed herein, it is not confined to the details set forth and this application is intended to cover such modifications or changes as may come within the purposes of the improvements or the scope of the following claims.

What is claimed is:

1. A reticle conveying system usable with a reticle keeping shelf having a plurality of supports for supporting a plurality of reticles, for conveying a reticle between the keeping shelf and an exposure station, said system comprising:
   a first conveying mechanism for conveying a reticle along a first path extending between the keeping shelf and the exposure station;
   a second conveying mechanism for conveying a reticle along a second path, different from the first path, and extending between an intermediate position along the first path and an inspecting station, different from the exposure station; and
   inspecting means provided at the inspecting station for inspecting a reticle conveyed thereto;
   wherein said first and second conveying mechanisms are operable so that during exposure of a first reticle at the exposure station, a second reticle is conveyed to the inspecting station for inspection thereof.

2. A reticle conveying system according to claim 1, wherein said first conveying mechanism conveys an encased reticle along a portion of the first path.

3. A method usable with a reticle keeping shelf having a plurality of supports for supporting a plurality of reticles, for conveying first and second reticles between the keeping shelf and an exposure station, said method comprising the steps of:
   conveying the first reticle to the exposure station along a first path extending between the keeping shelf and the exposure station;
   inspecting the first reticle before it is conveyed to the exposure station, said first reticle inspecting step comprising (i) conveying the first reticle from an intermediate position along the first path to an inspecting station, different from the exposure station, along a second path different from the first path, (ii) inspecting the first reticle at the inspecting station and (iii) conveying the first reticle after inspection back to the intermediate position;
   exposing the first reticle to radiation at the exposure station after the first reticle is conveyed thereto;
   conveying the first reticle, after exposure, back to the keeping shelf;
   conveying the second reticle to the exposure station along the first path;
   inspecting the second reticle before it is conveyed to the exposure station, said second reticle inspecting step comprising (i) conveying the second reticle from the intermediate position to the inspecting station, (ii) inspecting the second reticle at the inspecting station and (iii) conveying the second reticle after inspection back to the intermediate position;
   exposing the second reticle to radiation at the exposure station after the second reticle is conveyed thereto; and
   conveying the second reticle, after exposure, back to the keeping shelf;
   wherein the second reticle is conveyed to the inspecting station before completion of exposure of the first reticle at the exposure station, such that the second reticle can be inspected substantially during the exposure of the first reticle.

4. A reticle conveying system usable with a plurality of reticle cassettes each for accommodating a reticle therein, for conveying each reticle too an exposure station, said system comprising:
   a library for accommodating the reticle cassettes therein;
   a first conveying mechanism for conveying a reticle cassette from said library to an intermediate position;
   a holding mechanism for holding the reticle cassette at said intermediate position, wherein the reticle cassette held by said holding mechanism at said intermediate position is openable to allow a corresponding reticle to be taken out from the reticle cassette;
   a second conveying mechanism for taking the reticle out of the reticle cassette held by said holding mechanism and for conveying the reticle from said intermediate position to an inspecting station;
   an inspecting device for inspecting at said inspecting station the presence/absence of any foreign particle on the reticle taken out from the reticle cassette; and
   a third conveying mechanism for conveying the reticle having been inspected, from said inspecting station to said exposure station.

5. A system according to claim 4, wherein said holding mechanism is adapted to hold plural reticle cassettes at the same time.

6. A system according to claim 4, wherein said first conveying mechanism conveys each reticle cassette through a first region, and wherein said second conveying mechanism conveys each reticle cassette through a second region, and wherein said first and second regions are different in degrees of cleanliness.

7. A system according to claim 6, wherein the cleanliness of said second region is higher than that of said first region.

8. A system according to claim 4, wherein said conveying system is used with an exposure apparatus such that said first conveying mechanism is securedly supported by said exposure apparatus, and wherein said library is dismountable from the exposure apparatus.

9. A system according to claim 8, wherein said library is equipped with a terminal for allowing communication of information with said exposure apparatus.

10. A method usable with a plurality of reticle cassettes each for accommodating a reticle therein, for conveying each reticle to an exposure station, said method comprising the steps of:
   placing plural reticle cassettes in a library;
   taking a reticle cassette, accommodating a corresponding reticle, out of the library and conveying the reticle cassette to an intermediate position;
   opening at the intermediate position the reticle cassette conveyed thereto and taking the reticle out of the reticle cassette;
   conveying the reticle, taken out of the reticle cassette, to an inspecting station for inspection of the presence/absence of any foreign particle on the reticle through an inspecting device; and
   conveying the reticle having been inspected to the exposure station.

* * * * *

UNITED STATES PATENT AND TRADEMARK OFFICE
CERTIFICATE OF CORRECTION

PATENT NO. : 4,999,671

DATED : March 12, 1991

INVENTOR(S) : Kazuo Iizuka

It is certified that error appears in the above-identified patent and that said Letters Patent is hereby corrected as shown below:

COLUMN 1

Line 42, "are" should read --is--.

COLUMN 2

Line 46, "treated" should read --treated by--.

COLUMN 6

Line 51, "cause" should read --causes--.

COLUMN 9

Line 12, "allow" should read --arrow--;
    Line 24, "5" should be deleted; and
    Line 48, "meter" should read --meters--.

COLUMN 10

Line 3, "space. The" should read --space, the--.

UNITED STATES PATENT AND TRADEMARK OFFICE
CERTIFICATE OF CORRECTION

PATENT NO. : 4,999,671

DATED : March 12, 1991

INVENTOR(S) : Kazuo Iizuka

It is certified that error appears in the above-identified patent and that said Letters Patent is hereby corrected as shown below:

COLUMN 12

Line 2, "confirmation" should read --conformation of--.

Line 36, "as" should read --to--.

COLUMN 14

Line 38, "ably" should read --able--.

COLUMN 16

Line 59, "assembly" should read --assembly of--.

COLUMN 18

Line 3, "too" should read --to--.

Signed and Sealed this

First Day of December, 1992

Attest:

DOUGLAS B. COMER

*Attesting Officer*　　*Acting Commissioner of Patents and Trademarks*